(12) United States Patent
Yang et al.

(10) Patent No.: US 11,272,639 B2
(45) Date of Patent: Mar. 8, 2022

(54) HEAT DISSIPATION PANEL, HEAT DISSIPATION APPARATUS, AND ELECTRONIC DEVICE

(71) Applicant: Huawei Technologies Co., Ltd., Shenzhen (CN)

(72) Inventors: Guo Yang, Minsk (BY); Quanming Li, Dongguan (CN); Xiaohu Liu, Kiev (UA); Wei Li, Dongguan (CN); Zhiguo Zhang, Wuhan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 269 days.

(21) Appl. No.: 16/462,826

(22) PCT Filed: Feb. 7, 2017

(86) PCT No.: PCT/CN2017/073037
§ 371 (c)(1),
(2) Date: May 21, 2019

(87) PCT Pub. No.: WO2018/094877
PCT Pub. Date: May 31, 2018

(65) Prior Publication Data
US 2021/0185852 A1    Jun. 17, 2021

(30) Foreign Application Priority Data
Nov. 25, 2016    (CN) .......................... 201611053761.9

(51) Int. Cl.
*H05K 7/20*    (2006.01)
*G06F 1/20*    (2006.01)
*G06F 1/16*    (2006.01)

(52) U.S. Cl.
CPC ........... *H05K 7/2039* (2013.01); *G06F 1/203* (2013.01); *H05K 7/20145* (2013.01); *G06F 1/1616* (2013.01)

(58) Field of Classification Search
CPC .. H05K 7/2039; H05K 7/20145; G06F 1/203; G06F 1/1616
(Continued)

(56) References Cited

U.S. PATENT DOCUMENTS 5,992,155 A * 11/1999 Kobayashi .............. G06F 1/203
165/104.33
6,052,280 A * 4/2000 Dilley ..................... G06F 1/203
165/104.33
(Continued)

FOREIGN PATENT DOCUMENTS

CN    1508865 A    6/2004
CN    2762514 Y    3/2006
(Continued)

*Primary Examiner* — Anatoly Vortman
(74) *Attorney, Agent, or Firm* — Slater Matsil, LLP

(57) ABSTRACT

A heat dissipation apparatus includes a heat dissipation panel built in the electronic device. The heat dissipation panel includes a first heat conducting layer, including a first surface and a second surface. The first surface is a surface exposed to the outside when the first heat conducting layer is bent. The second surface is a surface opposite to the first surface. A first region on the first heat conducting layer is used to absorb heat released by a heat emitting component, and conduct the heat to a second region on the first heat conducting layer, to dissipate the heat. The heat dissipation panel also includes first flexible layer, including a third region. The third region adheres to a position that is on the second surface of the first heat conducting layer and that corresponds to a bending region.

13 Claims, 10 Drawing Sheets

(58) Field of Classification Search
USPC .................................................. 361/679.47
See application file for complete search history.

(56) References Cited

U.S. PATENT DOCUMENTS

| | | | |
|---|---|---|---|
| 6,075,696 A | 6/2000 | Progl et al. | |
| 6,324,055 B1* | 11/2001 | Kawabe | G06F 1/1616 |
| | | | 361/679.54 |
| 7,573,710 B2* | 8/2009 | Morino | G06F 1/203 |
| | | | 361/679.55 |
| 7,969,739 B2* | 6/2011 | Tsunoda | G06F 1/1616 |
| | | | 361/704 |
| 8,675,363 B2* | 3/2014 | Crooijmans | G06F 1/203 |
| | | | 361/704 |
| 9,127,898 B2* | 9/2015 | Wong | H04B 1/036 |
| 9,490,860 B2* | 11/2016 | Wu | H04M 1/185 |
| 9,600,041 B2* | 3/2017 | Ady | G06F 1/203 |
| 10,488,898 B2* | 11/2019 | Shah | H01L 23/34 |
| 2004/0057206 A1 | 3/2004 | Tomaru | H01L 23/3735 |
| | | | 361/679.54 |
| 2004/0146707 A1 | 7/2004 | Machida et al. | |
| 2005/0039879 A1* | 2/2005 | Hanai | H05K 7/20454 |
| | | | 165/46 |
| 2009/0212658 A1 | 8/2009 | McAvoy et al. | |
| 2010/0101763 A1 | 4/2010 | Huang et al. | |
| 2011/0242764 A1 | 10/2011 | Hill et al. | |
| 2013/0027886 A1 | 1/2013 | Crooijmans et al. | |
| 2013/0168058 A1 | 7/2013 | Chamseddine et al. | |
| 2018/0023904 A1* | 1/2018 | Kato | B32B 27/36 |
| | | | 165/80.2 |
| 2020/0245501 A1* | 7/2020 | Wu | H05K 7/20481 |

FOREIGN PATENT DOCUMENTS

| | | |
|---|---|---|
| CN | 101901036 A | 12/2010 |
| CN | 103576779 A | 2/2014 |
| CN | 103984398 A | 8/2014 |
| CN | 105159421 A | 12/2015 |
| JP | 2005321287 A | 11/2005 |
| JP | 2006093546 A | 4/2006 |
| JP | 2006216878 A | 8/2006 |
| JP | 2012164852 A | 8/2012 |

* cited by examiner

HEAT DISSIPATION PANEL, HEAT DISSIPATION APPARATUS, AND ELECTRONIC DEVICE

CROSS-REFERENCE TO RELATED APPLICATIONS

This application is a national stage of International Application No. PCT/CN2017/073037, filed on Feb. 7, 2017, which claims priority to Chinese Patent Application No. 201611053761.9, filed on Nov. 25, 2016. Both of the aforementioned applications are hereby incorporated by reference in their entireties.

TECHNICAL FIELD

This application relates to the field of electronic devices, and more specifically, to a heat dissipation panel, a heat dissipation apparatus, and an electronic device.

BACKGROUND

A heating problem of a portable electronic device such as a notebook computer is a main factor affecting normal operation of the electronic device. Heat generated inside the electronic device mainly comes from a central processing unit (CPU), a mainboard chip, and a graphics card. Therefore, when system temperature is excessively high, crash may even occur. This not only deteriorates use experience of a user, but also severely affects operation performance and a service life of a chip.

In the prior art, heat dissipation of many electronic devices such as a notebook computer mainly relies on air cooling. To be specific, a fan is disposed inside a notebook computer, and air flow is accelerated by using the fan, to reduce surface temperature of heat emitting elements inside the notebook computer. However, the heat dissipation manner brings about a series of problems such as noise and dust, and has a poor heat dissipation effect and low heating dissipation efficiency. With the development of portable electronic devices, an integration level, package density, and an operating frequency of chips continuously increase, increasing energy consumption of a single chip. A compact design of a device structure makes air-cooled heat dissipation more difficult. In addition, emergence of bendable electronic devices (for example, a mobile phone with a flexible display) poses a new challenge to heat dissipation. As a result, the conventional heat dissipation manner cannot meet a heat dissipation requirement of a new-type electronic device any more.

SUMMARY

This application provides a heat dissipation panel, a heat dissipation apparatus, and an electronic device that can be applied to a foldable or bendable electronic device.

According to a first aspect, a heat dissipation apparatus is provided, where the apparatus is applied to an electronic device and includes a heat dissipation panel built in the electronic device, where the heat dissipation panel includes at least: a first heat conducting layer, including a first surface and a second surface, where the first surface is a surface exposed to the outside when the first heat conducting layer is bent, the second surface is a surface opposite to the first surface, and a first region on the first heat conducting layer is used to absorb heat released by a heat emitting component, and conduct the heat to a second region on the first heat conducting layer, to dissipate the heat; and a first flexible layer, including a third region, where the third region adheres to a position that is on the second surface of the first heat conducting layer and that corresponds to a bending region.

The flexible layer adheres to the bending region on the heat conducting layer, so that a fillet is formed at a bent position of a heat conducting material. The fillet can be used to protect the heat conducting layer from being damaged when the heat conducting layer is bent or folded, thereby avoiding breakage or fracture. Due to high flexibility of a flexible material, the heat dissipation panel is less prone to breakage or fracture when being bent or folded. Therefore, reliability of the heat dissipation panel is improved as a whole. In addition, flexibility of the heat dissipation panel is improved by using the flexible layer, and heat dissipation efficiency of the heat dissipation panel is improved by using the heat conducting layer. Compared with an air-cooled heat dissipation manner in the prior art, space occupied by the heat dissipation apparatus can be reduced, and a problem of noise and dust generated in an operation process of the heat dissipation apparatus can be alleviated.

Optionally, the first flexible layer further includes a fourth region that adheres to a position on the second surface of the first heat conducting layer except the bending region, so that the third region and the fourth region completely cover the second surface of the first heat conducting layer.

The heat dissipation panel of this structure is manufactured more simply and conveniently.

Optionally, the heat dissipation panel further includes a second flexible layer that adheres to the first surface of the first heat conducting layer, and the second flexible layer partially or completely covers the first surface of the first heat conducting layer.

The first surface and the second surface of the heat conducting layer are protected respectively by using the flexible layers, so that the heat dissipation panel can be protected by the flexible layers when being bent in different directions, and the heat dissipation panel is less prone to breakage or fracture when being bent or folded. In addition, the heat conducting layer can be protected from being scratched or cut by an external object when being bent, thereby further improving reliability of the heat dissipation panel.

Optionally, an area of the first region is less than or equal to an area of the second region.

A relatively large heat dissipation area is used, to more quickly dissipate the heat, thereby improving heat dissipation efficiency.

Optionally, the heat dissipation apparatus further includes a fan, and the fan is located in a high-temperature region of the electronic device to enable air to flow between the high-temperature region and a low-temperature region, so that the heat is conducted from the first region on the heat conducting layer to the second region, where the high-temperature region is a region close to the heat emitting component in the electronic device, and the low-temperature region is a region away from the heat emitting component in the electronic device.

The fan and the heat dissipation panel are used cooperatively. The fan accelerates air flow between the high-temperature region and the low-temperature region, so that the heat is quickly conducted from the first region to the second region, thereby further improving heat dissipation efficiency.

Optionally, the heat dissipation apparatus further includes: a shielding cover, disposed on a lower surface of the heat dissipation panel, the shielding cover and a shielding base that is pre-disposed in the electronic device form a shielding case, the shielding case is configured to shield a chip, and the lower surface of the heat dissipation panel is a surface that is of the heat dissipation panel and that faces the heat emitting component.

Optionally, the shielding cover is built in a lower layer of material of the heat dissipation panel, and the lower layer of material is a material layer that is of the heat dissipation panel and that is the closest to the heat emitting component.

Optionally, the shielding cover is stuck to the lower surface of the heat dissipation panel.

The shielding cover and the shielding base that is pre-disposed in the electronic device form the shielding case, so that the heat emitting component such as the chip can be shielded, thereby reducing interference of the outside to the chip and reducing pollution to the chip.

Optionally, the heat dissipation apparatus further includes: a reinforced plate, stuck to a position that is on an upper surface of the heat dissipation panel and/or the lower surface of the heat dissipation panel and that corresponds to the bending region, the lower surface of the heat dissipation panel is a surface that is of the heat dissipation panel and that faces the heat emitting component, and the upper surface of the heat dissipation panel is a surface that is of the heat dissipation panel and that is opposite to the lower surface.

Reinforced plates are added to the upper surface and the lower surface of the heat dissipation panel, to not only protect the inner heat dissipation panel from being damaged, but also improve strength at a folded position, thereby reinforcing local bending and improving reliability.

Optionally, the reinforced plate includes an attached stainless steel sheet or copper alloy sheet.

Optionally, the first heat conducting layer includes a plurality of separated strip-shaped thermal pads, the plurality of separated strip-shaped thermal pads are arranged in parallel on the bending region, and each strip-shaped thermal pad is parallel to or approximately parallel to a heat conducting direction.

A strip-shaped heat conducting material having better flexibility is used on a rotating shaft position, to further improve a bending resistance capability of the heat conducting material, thereby improving reliability.

Optionally, the heat conducting layer is made of a heat conducting material whose coefficient of heat conductivity is greater than or equal to a first preset threshold, and the first preset threshold is 50 watt/(meter-kelvin).

Optionally, the heat conducting layer is made of the heat conducting material, and the heat conducting material includes graphite, copper foil, or aluminum foil.

Optionally, the flexible layers are made of a flexible material, and the flexible material includes polyimide or polyamide.

According to a second aspect, a heat dissipation panel is provided, including: a first heat conducting layer, where the first heat conducting layer is sheet-shaped and is made of a heat conducting material, and includes a first surface and a second surface, the first surface is a surface exposed to the outside when the first heat conducting layer is bent, and the second surface is a surface opposite to the first surface; and a first flexible layer, where the first flexible layer is sheet-shaped and is made of a flexible material, the first flexible layer includes a third region, and the third region adheres to a position that is on the second surface of the first heat conducting layer and that corresponds to a bending region.

The flexible layer adheres to the bending region on the heat conducting layer, so that a fillet is formed at a bent position of the heat conducting material. The fillet can be used to protect the heat conducting layer from being damaged when the heat conducting layer is bent or folded, thereby avoiding breakage or fracture. Due to high flexibility of the flexible material, the heat dissipation panel is less prone to breakage or fracture when being bent or folded. Therefore, reliability of the heat dissipation panel is improved as a whole. In addition, flexibility of the heat dissipation panel is improved by using the flexible layer, and heat dissipation efficiency of the heat dissipation panel is improved by using the heat conducting layer. Compared with an air-cooled heat dissipation manner in the prior art, space occupied by the heat dissipation apparatus can be reduced, and a problem of noise and dust generated in an operation process of the heat dissipation apparatus can be alleviated.

Optionally, the first flexible layer further includes a fourth region that adheres to a position on the second surface of the first heat conducting layer except the bending region, so that the third region and the fourth region completely cover the second surface of the first heat conducting layer.

The heat dissipation panel of this structure is manufactured more simply and conveniently.

Optionally, the heat dissipation panel further includes a second flexible layer, the second flexible layer is sheet-shaped and is made of the flexible material, the second flexible layer adheres to the first surface of the first heat conducting layer, and the second flexible layer partially or completely covers the first surface of the first heat conducting layer.

The first surface and the second surface of the heat conducting layer are protected respectively by using the flexible layers, so that the heat dissipation panel can be protected by the flexible layers when being bent in different directions, and the heat dissipation panel is less prone to breakage or fracture when being bent or folded. In addition, the heat conducting layer can be protected from being scratched or cut by an external object when being bent, thereby further improving reliability of the heat dissipation panel.

Optionally, the heat conducting layer is made of a heat conducting material whose coefficient of heat conductivity is greater than or equal to a first preset threshold, and the first preset threshold is 50 watt/(meter-kelvin).

Optionally, the heat conducting material includes graphite, copper foil, or aluminum foil.

Optionally, the flexible material includes polyimide or polyamide.

According to a third aspect, an electronic device is provided, including a heat emitting component, and the heat dissipation apparatus in any possible implementation of the first aspect.

The heat dissipation panel and the heat dissipation apparatus provided in this application can be applied to various non-folded, foldable, or bendable electronic devices. Flexibility of the heat dissipation panel is improved by using the flexible material, and heat dissipation efficiency of the heat dissipation panel is improved by using the heat conducting material. Compared with the air-cooled heat dissipation manner in the prior art, space occupied by the heat dissipation apparatus can be reduced, and a problem of noise and dust generated in an operation process of the heat dissipation apparatus can be alleviated.

DETAILED DESCRIPTION OF ILLUSTRATIVE EMBODIMENTS

The following describes the technical solutions in this application with reference to the accompanying drawings.

Figure 1:
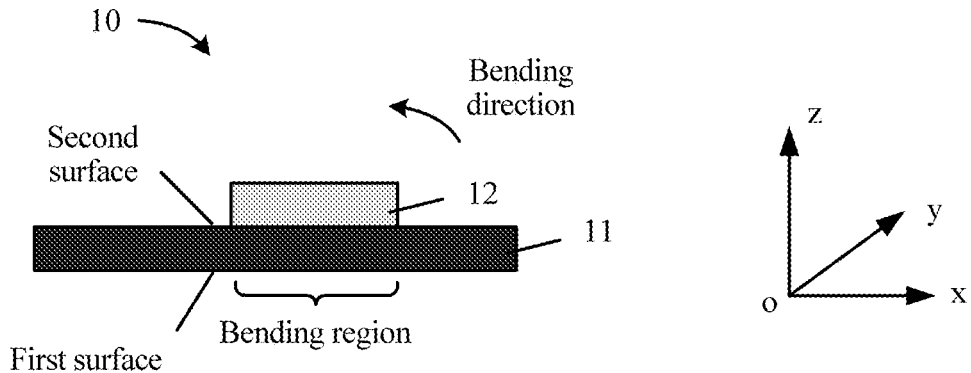
FIG. 1 and FIG. 2 are schematic structural diagrams of a heat dissipation panel according to an embodiment of this application.
Figure 2:
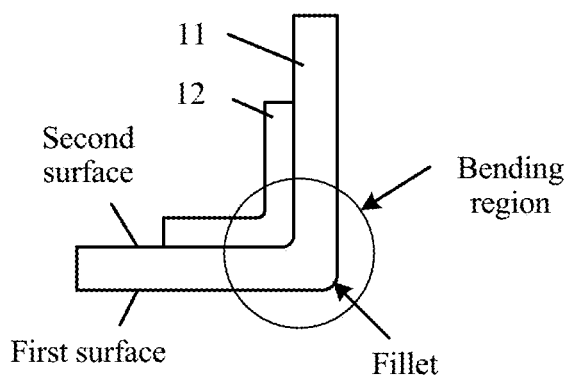

FIG. 1 and FIG. 2 are schematic structural diagrams of a heat dissipation panel 10 according to an embodiment of this application. As shown in FIG. 1, the heat dissipation panel 10 includes at least a first heat conducting layer 11 and a first flexible layer 12. The first heat conducting layer is sheet-shaped and is made of a heat conducting material whose heat conductivity is greater than or equal to a first preset threshold. The first flexible layer is sheet-shaped and is made of a flexible material.

To be specific, the heat dissipation panel may be obtained by combining at least one layer of flexible material and at least one layer of heat conducting material. The heat conducting material has a relatively high coefficient of heat conductivity, and is used to implement rapid heat conduction. The flexible material is highly flexible and is deformable and foldable. The heat dissipation panel obtained through combining the heat conducting material and the flexible material has both flexibility of the flexible material and heat conductivity of the heat conducting material, so that the heat dissipation panel can be applied to heat dissipation apparatuses of various foldable or bendable electronic devices, for example, portable electronic devices such as a flip phone and a clamshell notebook computer, and wearable devices such as a flexible display, virtual reality (Virtual Reality, VR), and augmented reality (Augmented Reality, AR).

As an example instead of a limitation, the first preset threshold is 50 watt/(meter-kelvin) (W/(m·K)).

As an example instead of a limitation, the flexible material includes polyimide (Polyimide, PI) or polyamide (Polyamide, PA, or referred to as nylon). The heat conducting material includes graphite, aluminum foil, or copper foil. In an embodiment, the heat dissipation panel is made of PI and graphite.

For example, a coefficient of heat conductivity of PI is greater than or equal to 300 W/(m·K).

It should be noted that the flexible material may be understood as a material that has flexibility and can bear appropriate deformation. Flexibility is opposite to rigidity, and is a physical property of a material. After the flexible material is deformed under stress, and the material cannot be automatically restored to an original shape after acting force disappears. The flexible material is a material that can be deformed (for example, expanded or contracted, bent, twisted, extruded, or deformed) without losing performance. Therefore, the flexible material may be referred to as a material having high tensile strength and a large elongation rate. No breakage occurs on a deformed region on the deformed flexible material, and an inner structure is not exposed. After a flexible material having a smooth surface is deformed, a deformed region still presents a smooth and seamless surface. In addition, the flexible material can be restored to the original shape under external force after being bent for a plurality of times, and has a particular service life.

Referring to FIG. 2, the first heat conducting layer includes a first surface and a second surface, the first surface is a surface exposed to the outside when the first heat conducting layer is bent (as shown in FIG. 2), and the first flexible layer adheres to at least a bending region on the second surface of the first heat conducting layer. For ease of distinguishing, a region that is on the first flexible layer and that corresponds to the bending region is marked as a third region.

The flexible layer adheres to the bending region on the heat conducting layer, so that a fillet is formed at a bent position of the flexible material (as shown in FIG. 2). The fillet can be used to protect the heat conducting layer from being damaged when the heat conducting layer is bent or folded, thereby avoiding breakage or fracture. Due to high flexibility of the flexible material, the heat dissipation panel is less prone to breakage or fracture when being bent or folded. Therefore, reliability of the heat dissipation panel is improved as a whole.

Herein, it should be noted that because the flexible layer adheres to the bending region on the heat conducting layer, the fillet is formed at the bent position of the flexible layer. Such vivid description is provided for ease of understanding. This application does not specially limit a size of the fillet. In other words, the fillet may have the following form when the heat conducting layer is deformed: a bending radius of the fillet generated when the heat conducting layer adhering to the flexible layer is folded or bent is necessarily greater than a bending radius of a fillet generated when a heat conducting layer not adhering to a flexible layer is folded or bent. Therefore, when the heat conducting layer is deformed, the fillet can protect the heat conducting layer from being damaged, or from being broken and forming a crack at a deformed position, or from being fractured.

In this embodiment of this application, a plane on which the heat dissipation panel is placed (for ease of distinguishing and description, the plane is marked as a first plane, and is an xoy plane shown in FIG. 1) is a two-dimensional thin film, the heat dissipation panel may be obtained by stacking at least one layer of heat conducting material and at least one layer of flexible material in a first direction (for ease of distinguishing and description, a direction perpendicular to the first plane is marked as the first direction, to be specific, an oz direction shown in FIG. 1), and any two layers of materials may be stuck to each other by using adhesive (for example, a double faced adhesive tape).

Optionally, the first flexible layer further includes a fourth region that adheres to the second surface of the first heat conducting layer, so that the third region and the fourth region completely cover the second surface of the first heat conducting layer.

Figure 3:
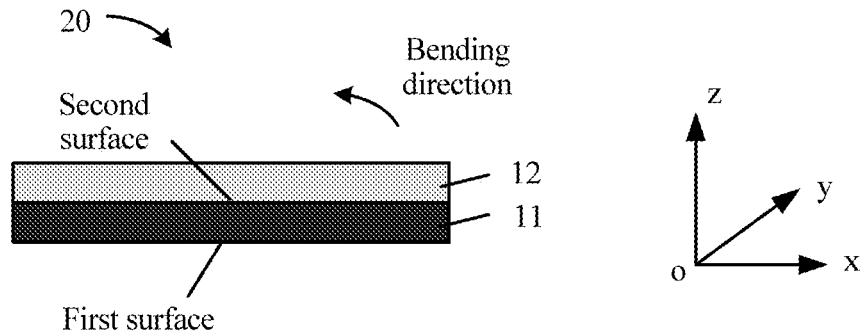
FIG. 3 is a schematic structural diagram of a heat dissipation panel according to another embodiment of this application.

FIG. 3 is a schematic structural diagram of a heat dissipation panel 20 according to another embodiment of this application. As shown in FIG. 3, the heat dissipation panel 20 includes the first heat conducting layer 11 and the first flexible layer 12 shown in FIG. 1. Different from FIG. 1, the first flexible layer may completely cover the first heat conducting layer, in other words, a projection of the first flexible layer on a first plane completely overlaps with that of the first heat conducting layer on the first plane. Because the heat dissipation panel has a two-dimensional thin film structure, compared with the structure shown in FIG. 1, the structure shown in FIG. 3 is manufactured more simply and conveniently.

Optionally, the heat dissipation panel further includes a second flexible layer that adheres to a first surface of the first heat conducting layer, and the second flexible layer partially or completely covers the first surface of the first heat conducting layer.

Figure 4:
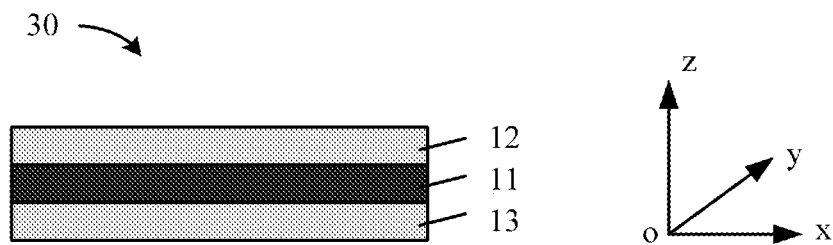
FIG. 4 is a schematic structural diagram of a heat dissipation panel according to still another embodiment of this application.

FIG. 4 is a schematic structural diagram of a heat dissipation panel 30 according to still another embodiment of this application. As shown in FIG. 4, in addition to the first heat conducting layer 1 and the first flexible layer 12 shown in FIG. 1, the heat dissipation panel 30 further includes a second flexible layer 13. The second flexible layer adheres to a first surface of the first heat conducting layer. The second flexible layer may adhere to only a bending region on the first heat conducting layer, or may completely cover the first surface of the first heat conducting layer.

It should be understood that FIG. 4 is merely an example and shows case in which the first flexible layer completely covers a second surface of the first heat conducting layer and the second flexible layer completely covers the first surface of the first heat conducting layer. However, this should not constitute any limitation to this application. For example, any layer of the first flexible layer and the second flexible layers may adhere to only the bending region on the first heat conducting layer, to protect the heat conducting layer from being damaged when the heat conducting layer is bent or folded and avoid breakage or fracture.

For ease of description, a structure of sandwiching a heat conducting layer between two flexible layers shown in FIG. 4 is referred to as an "ABA" structure. It should be understood that the "ABA" structure shown in FIG. 4 is merely a typical structure of the heat dissipation panel. However, this should not constitute any limitation to this application. This application does not specially limit a quantity of layers of flexible materials, a quantity of layers of heat conducting materials, and a sequence between layers. For example, the heat dissipation panel may be obtained by combining two layers of flexible materials and two layers of heat conducting materials, and the two layers of heat conducting materials may be located between the two layers of flexible materials, to form an "ABBA" structure.

It should be noted that in this embodiment of this application, a structure of combining at least one heat conducting layer and at least one flexible layer is referred to as a flexible heat conducting material, and one layer of flexible heat conducting material includes at least: one heat conducting layer and one flexible layer (as shown in FIG. 1, FIG. 3, and FIG. 4).

It should be understood that specific content of the flexible material and specific content of the heat conducting material that are shown above are merely example descriptions, and should not constitute any limitation to this application. This application does not exclude a heat dissipation panel obtained by combining another flexible material or heat conducting material instead of the foregoing listed materials, to implement a same function as the foregoing heat dissipation panel.

For example, the heat conducting material may be a liquid or granular material having a high coefficient of heat conductivity. For example, the coefficient of heat conductivity of the heat conducting material may be greater than or equal to the first preset threshold described above. Alternatively, a threshold of the coefficient of heat conductivity is re-defined based on a form of the material, so that the material can quickly conduct heat to implement a heat dissipation function.

It should be noted that when the heat conducting material is a liquid or granular material, the heat conducting material needs to be sealed in enclosed space by using another material, to avoid pollution and damage caused to an electronic device due to leakage of the heat conducting material. In this case, the material used to seal the heat conducting material may be the flexible material provided in this application, or may be another flexible material. This is not specially limited in this application.

Therefore, according to the heat dissipation panel in this embodiment of this application, the flexible material and the heat conducting material are combined, so that the combined material has both relatively high flexibility and relatively high heat conductivity, and can be applied to heat dissipation apparatuses of various bendable or foldable electronic devices, thereby ensuring reliability and further providing a relatively good heat dissipation effect.

Figure 5:
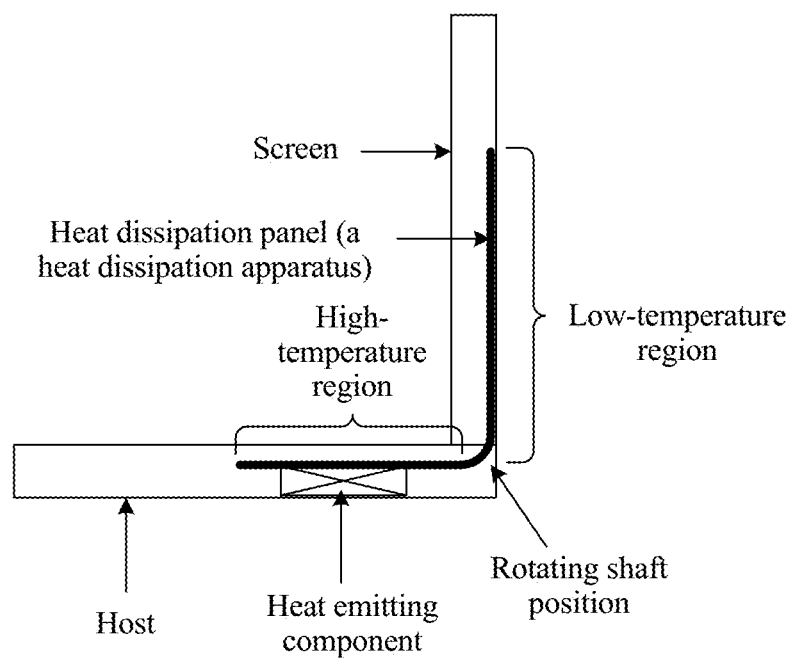
FIG. 5 to FIG. 10 are schematic diagrams of applying a heat dissipation apparatus to an electronic device according to an embodiment of this application.

FIG. 5 to FIG. 10 are schematic diagrams of applying a heat dissipation apparatus to an electronic device according to an embodiment of this application. As shown in FIG. 5 to FIG. 10, the electronic device may be a notebook computer. FIG. 5 is a schematic diagram of a cross section when a screen of the notebook computer is opened up. It can be learned that a heat emitting component in the notebook computer is located at a position that is in a host and that is close to a rotating shaft, and is specifically located on a high-temperature region shown in FIG. 5. As shown in FIG. 5, a drive component such as a liquid crystal display (Liquid Crystal Display, LCD) in the screen emits little heat, and a substrate has no source of heat, and therefore is a low-temperature region of the electronic device. Therefore, the high-temperature region and the low-temperature region are not on a same plane. This requires that a heat dissipation panel is folded and even repeatedly folded on a rotating shaft position of the notebook computer when the heat dissipation panel dissipates heat. Therefore, a heat dissipation panel with both relatively high flexibility and relatively high heat conductivity may be used in the heat dissipation apparatus for heat dissipation. For example, the heat dissipation apparatus may include the heat dissipation panel provided in the embodiments of this application. However, this should not constitute any limitation to this application. This application does not exclude a possibility that there is a material having both high flexibility and high heat conductivity in the prior art or in a future technology. For example, the flexible heat conducting material may be flexible graphite or a flexible VC.

Figure 6:
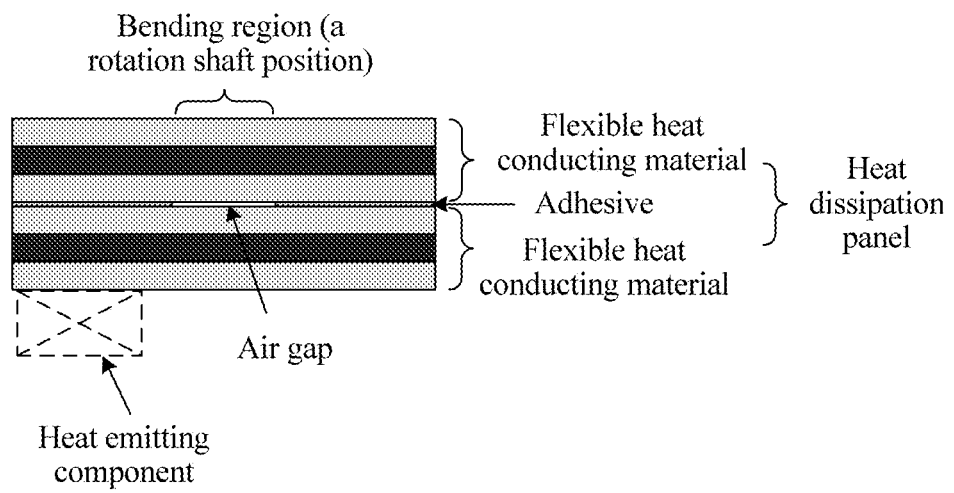
Figure 7:
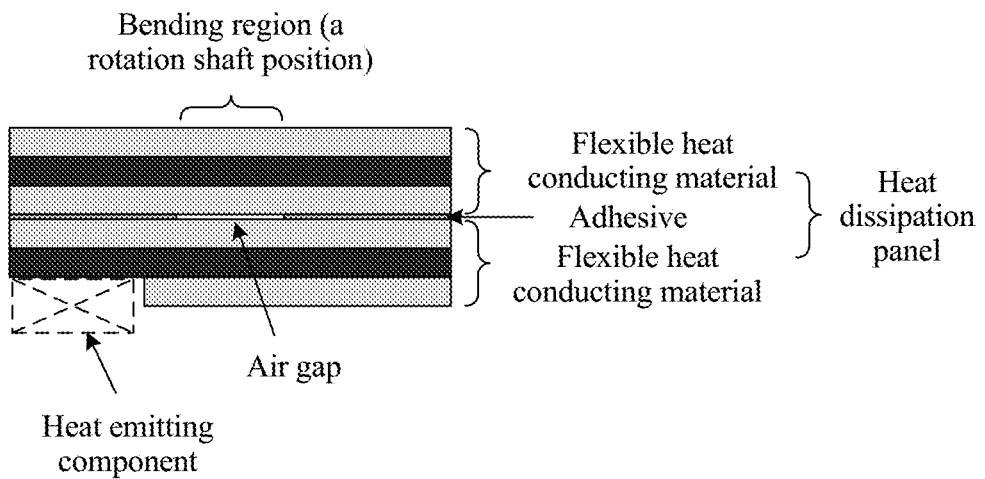

In consideration of repeated opening and closing of the notebook computer, namely, a feature of repeated folding on the rotating shaft position, the heat dissipation panel provided in the embodiments of this application may be used. FIG. 6 and FIG. 7 are cross-sectional views of the heat dissipation panel. As shown in the figures, the heat dissipation panel may be obtained by stacking at least one layer of flexible heat conducting material. Specifically, the heat dissipation panel includes a first region and a second region, the first region and the second region are two consecutive regions, the first region is close to or in contact with the heat emitting component in the notebook computer, and the second region is located on the low-temperature region of the notebook computer. The first region is used to absorb heat released by the heat emitting component and conduct the heat to the second region, to dissipate the heat.

As shown in FIG. 6 and FIG. 7, the heat dissipation panel may include two layers of flexible heat conducting materials, and each layer of flexible heat conducting material may include a first flexible layer, a first heat conducting layer, and a second flexible layer. The first flexible layer and the second flexible layer respectively completely cover a second surface and a first surface of the first heat conducting layer (as shown in FIG. 6). The flexible layer is close to or in contact with the heat emitting component, absorbs the heat released by the heat emitting component, and conducts the heat to the heat conducting layer. Then, the heat conducting layer conducts the heat to the second region. It may be understood that the heat dissipation panel is made of a thin film material whose thickness is at a micron level. Therefore, a flexible material has very small thermal resistance, and easily transfers heat to a heat conducting material layer. Optionally, thickness of the flexible layers is less than 100 microns (μm). For example, the thickness of the flexible layer may be 30 μm or 70 μm.

Alternatively, the second flexible layer may partially cover the first surface of the first heat conducting layer (as shown in FIG. 7), so that the first heat conducting layer can be directly close to or in contact with the heat emitting component, to better absorb the heat released by the heat emitting component, thereby improving heat dissipation efficiency.

It should be understood that layers included in the heat dissipation panel and a relative position relationship between the layers are described above in detail with reference to FIG. 1 to FIG. 4. For brevity, details are not described herein again.

In this embodiment of this application, if the heat dissipation panel includes a plurality of layers of flexible heat conducting materials, any two layers of flexible heat conducting materials may be stuck to each other by using adhesive. Optionally, an air gap may be disposed on an adhesion position between any two layers of flexible heat conducting materials (as shown in FIG. 6 and FIG. 7).

Because the heat dissipation panel may be obtained by stacking at least one layer of flexible heat conducting material, when the heat dissipation panel is folded or bent, interaction force may be caused due to different bending radiuses of layers. Introduction of the air gap may reduce the interaction force, thereby further improving reliability.

It should be understood that in the heat dissipation panel shown in FIG. 6 and FIG. 7, an air gap may be disposed on an adhesion position between layers of flexible heat conducting materials. However, this is merely a possible implementation, and should not constitute any limitation to this application. In the heat dissipation apparatus shown in FIG. 6 and FIG. 7, layers of flexible heat conducting materials may be completely stuck to each other by using adhesive, and no air gap is disposed.

It should be further understood that the schematic diagrams of the heat dissipation panel shown in FIG. 6 and FIG. 7 are merely example descriptions, and should not constitute any limitation to this application. The heat dissipation panel may include one or more layers of flexible heat conducting materials, or each layer of flexible heat conducting material may have an "ABBA" structure. This is not specially limited in this application.

It should be noted that in the notebook computer shown in the figures, because the rotating shaft exists on the bent position, a through hole or a blind hole may be reserved on the heat dissipation panel for the rotating shaft, or the heat dissipation panel may bypass the rotating shaft, or the rotating shaft may be bypassed and packed in a heat dissipation material. This is not specially limited in this application.

Optionally, an area of the first region is less than or equal to an area of the second region.

Specifically, the area of the second region may be increased to be the same as or greater than the area of the first region. To be specific, a heat dissipation area is enlarged, to achieve better temperature equalization and heat dissipation effects and improve heat dissipation efficiency.

Figure 8:
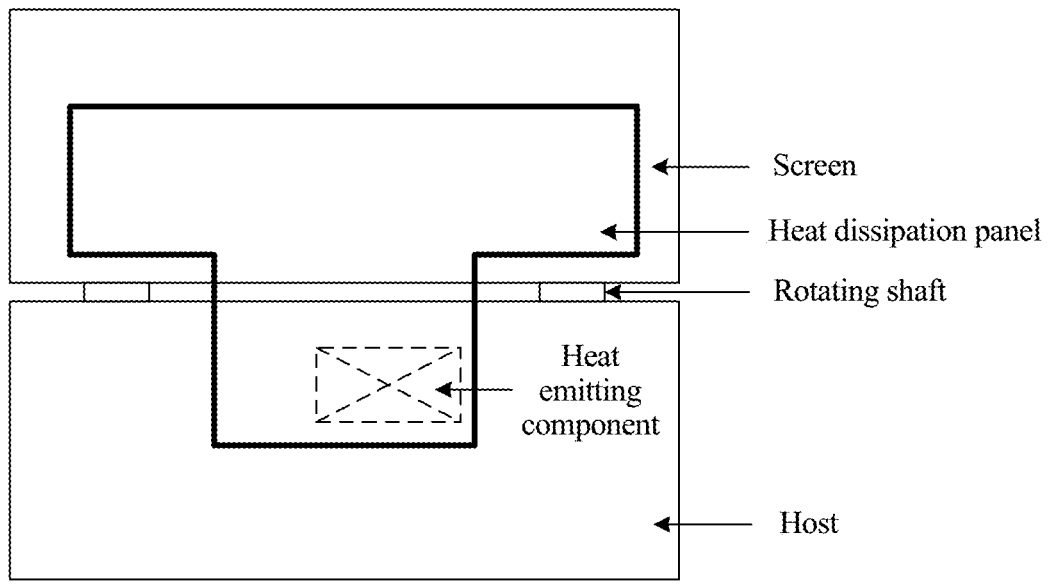
Figure 9:
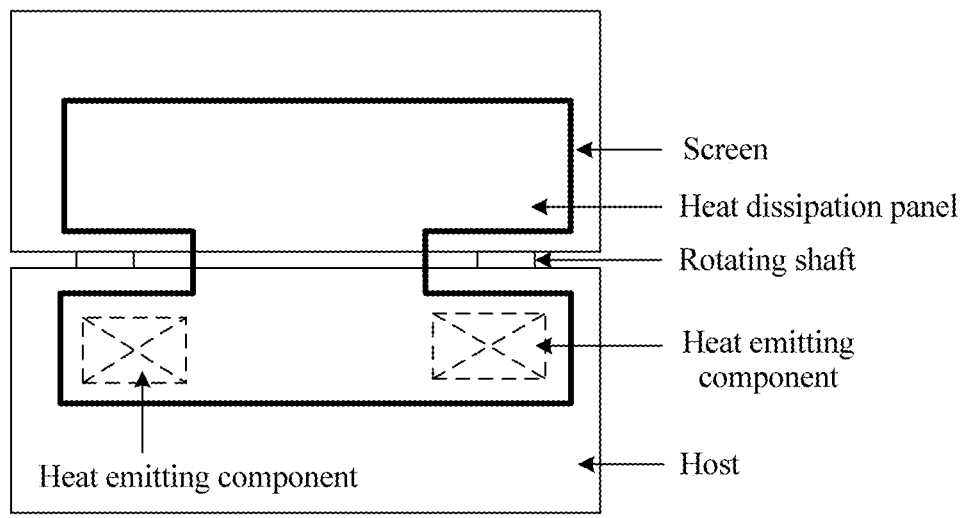
Figure 10:
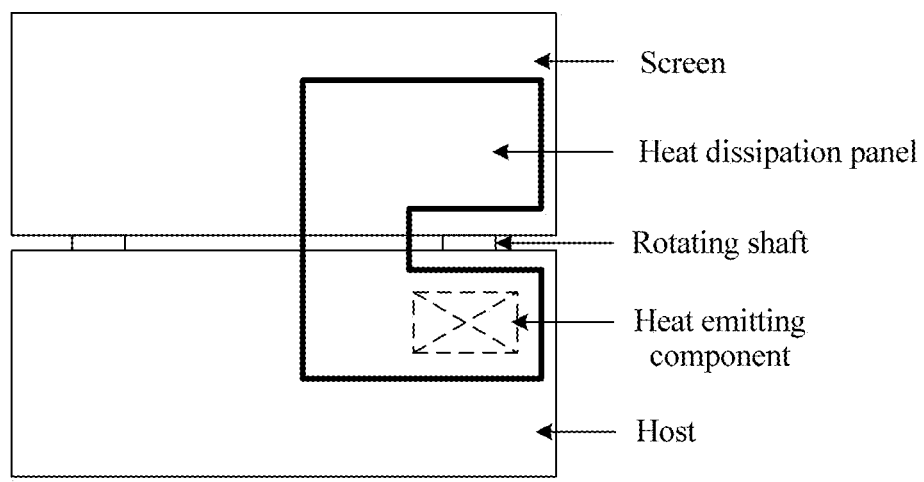

FIG. 8 to FIG. 10 are schematic diagrams of a notebook computer and a heat dissipation panel from the perspective of the front of the screen. The heat dissipation panel may have different shapes to cooperate with a position of the heat emitting component (namely, a position of the high-temperature region), a position of the low-temperature region, and a structure of the notebook computer. For example, as shown in FIG. 8, if the heat emitting component is located at a position that is close to the center in the host, the heat dissipation panel may have a "T" shape to cooperate with the position of the heat emitting component (namely, the position of the high-temperature region), the position of the low-temperature region, and the structure of the notebook computer. For another example, as shown in FIG. 9, if the heat emitting component is relatively close to edge positions at two sides of the host, the heat dissipation panel may have an "H" shape. For another example, as shown in FIG. 10, if the heat emitting component is close to only an edge position at one side of the host, the heat dissipation panel may have a "U" shape, or another shape by using which heat can be conducted to the low-temperature region.

It should be understood that the shapes of the heat dissipation panel and a manner of disposing the heat dissipation panel in the electronic device in the examples in FIG. 5 to FIG. 10 are merely example descriptions, and should not constitute any limitation to this application. The heat dissipation panel may be alternatively used cooperatively with another apparatus having a heat dissipation function such as a heat dissipater or a heat dissipation panel. For example, the second region on the heat conducting layer in the heat dissipation panel may be extended to the heat dissipater, to accelerate heat dissipation.

Therefore, the heat dissipation apparatus provided in this application can be applied to various foldable or bendable electronic devices. Flexibility of the heat dissipation panel is improved by using a flexible material, and heat dissipation efficiency of the heat dissipation panel is improved by using a heat conducting material. Compared with an air-cooled heat dissipation manner in the prior art, space occupied by the heat dissipation apparatus can be reduced, and a problem of noise and dust generated in an operation process of the heat dissipation apparatus can be alleviated.

Optionally, the heat dissipation apparatus may further include: a reinforced plate. The reinforced plate is stuck to a position that is on an upper surface of the heat dissipation panel and/or a lower surface of the heat dissipation panel and that corresponds to a bending region. The lower surface of the heat dissipation panel is a surface that is of the heat dissipation panel and that faces the heat emitting component, and the upper surface of the heat dissipation panel is a surface opposite to the lower surface of the heat dissipation panel.

Figure 11:
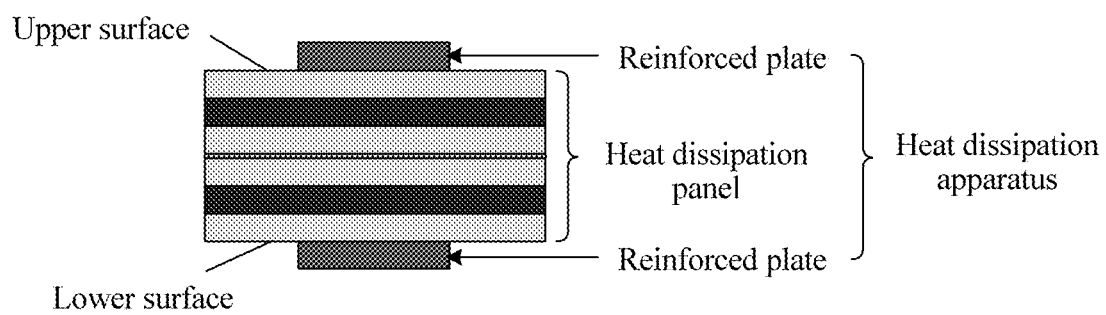
FIG. 11 is a schematic structural diagram of a heat dissipation panel according to an embodiment of this application.

FIG. 11 is a schematic structural diagram of a heat dissipation panel according to an embodiment of this application. As shown in FIG. 11, the heat dissipation apparatus includes a heat dissipation panel and a reinforced plate, and the reinforced plate is stuck to an upper surface and/or a lower surface of the heat dissipation panel. The lower surface of the heat dissipation panel is a surface facing an outer surface of the heat emitting component, and the upper surface of the heat dissipation panel is a surface opposite to the lower surface, to be specific, a surface away from the heat emitting component. Because the upper surface and the lower surface are both exposed surfaces of the heat dissipation panel, the upper surface and the lower surface are prone to scratch, cut, or puncture caused by another hard object. Therefore, a layer of reinforced plate may be stuck to the upper surface and/or the lower surface based on a situation, so that not only the inner heat dissipation panel can be protected from being damaged, strength of a folded position can be further improved, thereby reinforcing partial bending and improving reliability.

As an example instead of a limitation, the reinforced plate may be a metal sheet such as an attached stainless steel sheet or copper alloy sheet.

In this embodiment of this application, there may be one or more reinforced plates. This is not limited in this application. In addition, the reinforced plate may be directly applied to the heat dissipation panel when the reinforced plate is a metal sheet with both flexibility and heat conductivity.

Optionally, the heat dissipation apparatus further includes: a shielding cover, disposed on the lower surface of the heat dissipation panel. The shielding cover and a shielding base that is pre-disposed in an electronic device form a shielding case. The shielding case is configured to shield a chip.

Figure 12:
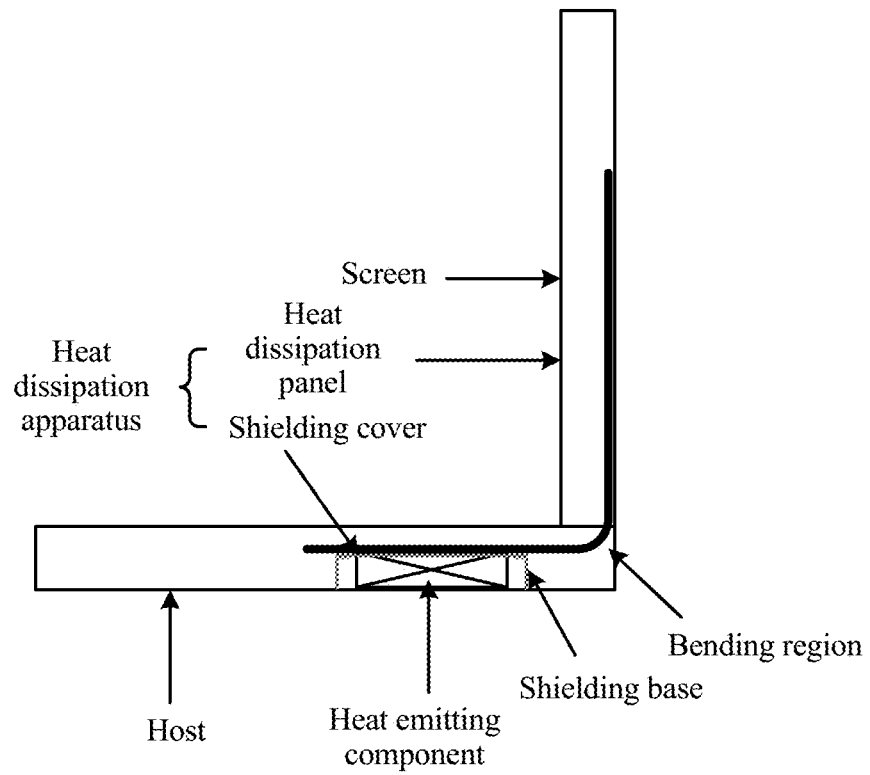
FIG. 12 is a schematic diagram of applying a heat dissipation apparatus to an electronic device according to another embodiment of this application.

The chip is a main heat emitting component in the electronic device. An antenna module may be further configured in the same electronic device (for example, a notebook computer), to receive and transmit signals. To avoid interference of the antenna module to the chip, the chip may be shielded by using a metal structure. FIG. 12 is a schematic diagram of applying a heat dissipation apparatus to an electronic device according to still another embodiment of this application. As shown in FIG. 12, the heat dissipation apparatus includes a heat dissipation panel and a shielding cover. Usually, a shielding base is pre-disposed on a printed circuit board (Printed Circuit Broad, PCB) of the electronic device. A shielding case may be disposed at a corresponding position on the heat dissipation panel of the heat dissipation apparatus based on a position of the shielding base. It may be understood that a position of the shielding cover corresponds to the chip, to be specific, the shielding cover is located on a first region on the heat dissipation panel.

Figure 13:
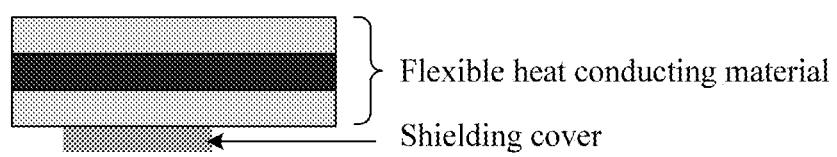
FIG. 13 is a schematic structural diagram of a heat dissipation panel according to another embodiment of this application.

In a possible implementation, the shielding cover may be stuck to the lower surface of the heat dissipation panel. FIG. 13 shows another example of a heat dissipation panel. As shown in FIG. 13, a metal shielding cover is stuck to a lower surface of the heat dissipation panel. The shielding cover and the lower shielding base form a shielding case, to shield a chip.

Figure 14:
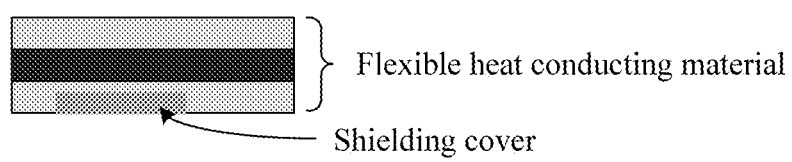
FIG. 14 is a schematic structural diagram of a heat dissipation panel according to still another embodiment of this application.

In another possible implementation, the shielding cover may be built in a lower layer of material of the heat dissipation panel. The lower layer of material is a material layer that is of the heat dissipation panel and that is the closest to the heat emitting component. FIG. 14 shows another example of a heat dissipation panel. As shown in FIG. 14, a metal shielding cover is built in the lower layer of material of the heat dissipation panel. A surface that is of the shielding cover and that is exposed to the lower layer of flexible material and the lower shielding base form the shielding case, to shield the chip.

It should be understood that the heat dissipation panels shown in FIG. 12 to FIG. 14 are merely examples, and should not constitute any limitation to this application. The shielding cover may be disposed in another manner on a position corresponding to the shielding base, to form the shielding case, thereby shielding the chip and reducing interference of another module (for example, the antenna module) in the electronic device to the chip.

Optionally, the heat dissipation apparatus further includes a fan. The fan is located on a high-temperature region of the electronic device to enable air to flow between the high-temperature region and a low-temperature region, so that heat is conducted from the first region to the second region.

Figure 15:
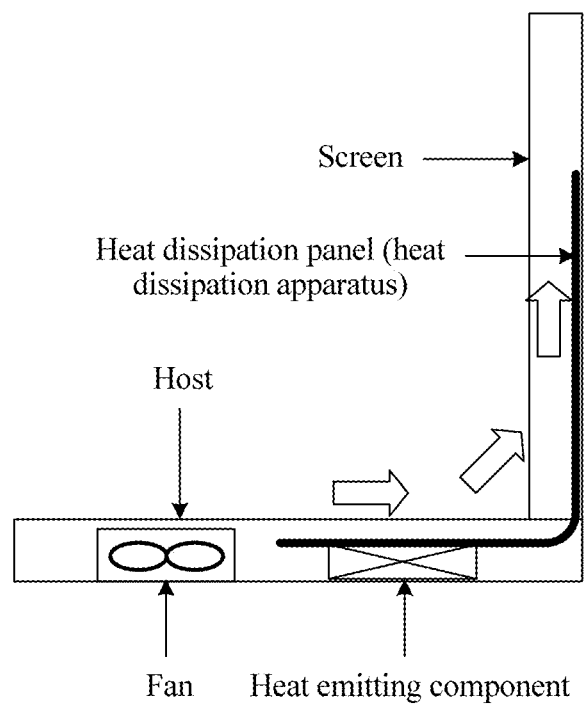
FIG. 15 and FIG. 16 are schematic diagrams of applying a heat dissipation apparatus to an electronic device according to yet another embodiment of this application.
Figure 16:
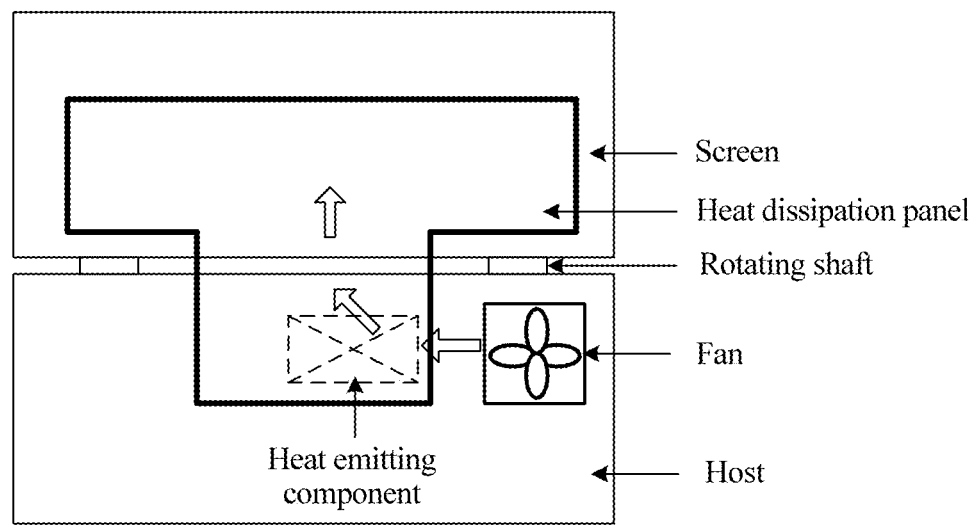

FIG. 15 and FIG. 16 are schematic diagrams of applying a heat dissipation apparatus to an electronic device according to yet another embodiment of this application. As shown in FIG. 15, the electronic device may be a notebook computer, and the heat dissipation apparatus includes a heat dissipation panel and a fan. The fan may be located near a heat emitting component in the notebook computer, namely, a high-temperature region. Specifically, the fan may be disposed near a source in a heat conducting direction of the heat dissipation panel (as shown in FIG. 16). FIG. 16 is a schematic diagram showing that a fan accelerates air flow. An arrow in the figure schematically shows a conducting direction of hot air. It can be learned that the fan and the heat dissipation panel are used cooperatively in the heat dissipation apparatus, and the fan accelerates air flow between the high-temperature region and a low-temperature region, so that the heat is quickly conducted from a first region to a second region, thereby further improving heat dissipation efficiency.

It should be understood that there may be one or more fans, and this is not specially limited in this application.

Optionally, a first heat conducting layer includes a plurality of separated strip-shaped thermal pads, the plurality of separated strip-shaped thermal pads are arranged in parallel on a bending region, and each strip-shaped thermal pad is parallel to or approximately parallel to the heat conducting direction.

Figure 17:
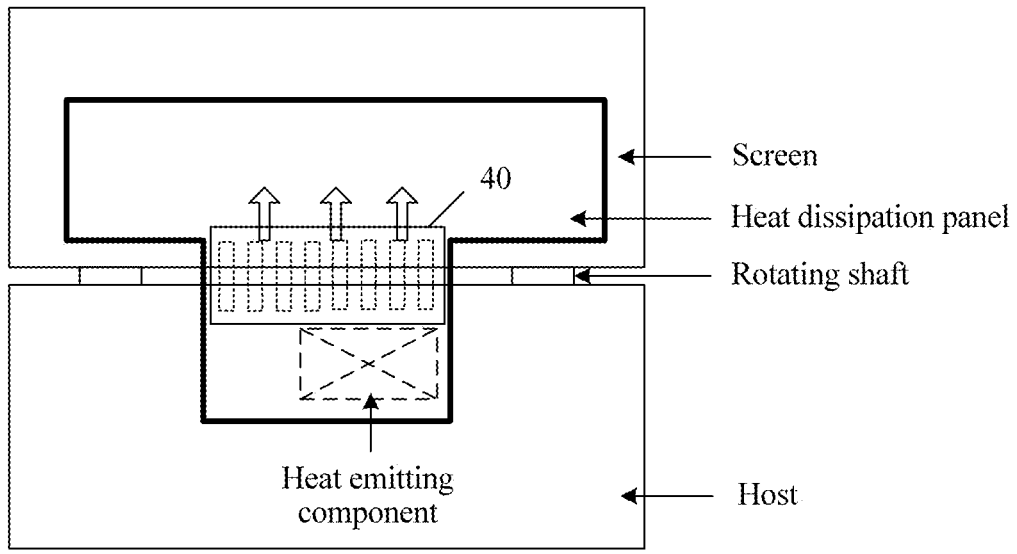
FIG. 17 is a schematic diagram of applying a heat dissipation apparatus to an electronic device according to yet another embodiment of this application.

FIG. 17 is a schematic diagram of applying a heat dissipation apparatus to an electronic device according to yet another embodiment of this application. As shown in FIG.

17, the electronic device may be a notebook computer. The heat dissipation apparatus may be disposed in the notebook computer in a direction shown in FIG. 17. A first region is located on a high-temperature region, and a second region is located on a low-temperature region. Strip-shaped thermal pads are located on a bending region on a heat dissipation panel (namely, on a rotating shaft position of the notebook computer, where the strip-shaped thermal pads may correspond to 40 in FIG. 17), and are arranged in parallel on the bending region, to form a bundle structure. A strip-shaped heat conducting material such as a graphite fiber is used on the rotating shaft position. Compared with graphite in a form of a thin film, the graphite fiber is more flexible, thereby further increasing a bending resistance capability of the flexible material and improving reliability. In addition, each strip-shaped thermal pad is parallel to or approximately parallel to a heat conducting direction, thereby facilitating heat conducting, in other words, facilitating heat dissipation.

Figure 18:
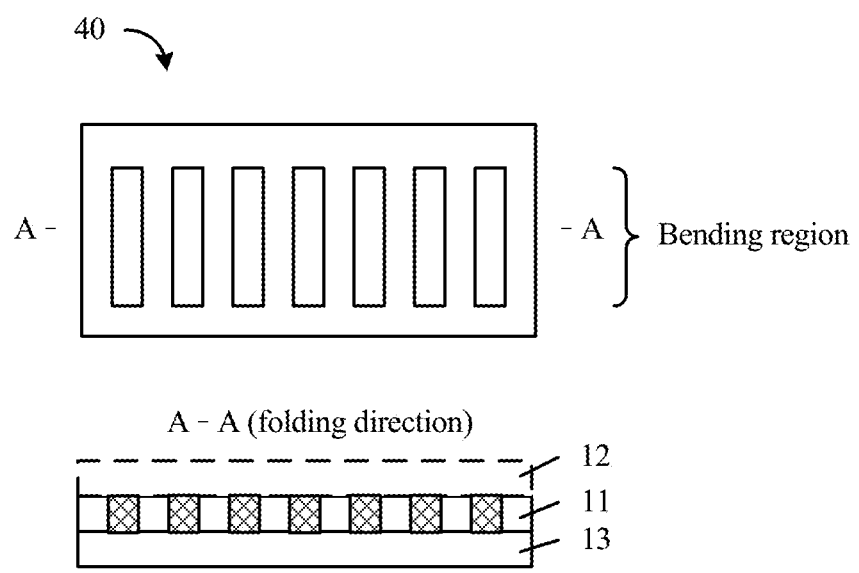
FIG. 18 is a schematic structural diagram of a heat dissipation structure according to yet another embodiment of this application.

FIG. 18 is a schematic structural diagram of a heat dissipation panel according to still another embodiment of this application. Specifically, FIG. 18 is a top view of a bending region 40 excluding a first flexible layer and a schematic structural diagram of an A-A cross section. As shown in FIG. 18, at least one heat conducting layer in the heat dissipation panel may present a bundle structure with parallel arrangement on the bending region. For ease of understanding, FIG. 18 further shows the schematic structural diagram of the A-A cross section. The heat dissipation panel may include the first heat conducting layer 11, the first flexible layer 12, and the second flexible layer 13 that are described above (as shown in FIG. 4). The A-A cross section presents sections of strip-shaped thermal pads of the first heat conducting layer on positions.

It should be understood that the heat dissipation panel shown in FIG. 18 is merely an example. In the at least one heat conducting layer included in the heat dissipation panel, one or more heat conducting layers may be designed into the bundle structure shown in FIG. 18. In addition, optionally, the bundle structure may penetrate the heat dissipation panel in a heat conducting direction. This is not specially limited in this application.

A case of applying the heat dissipation apparatus in the embodiments of this application to the notebook computer is shown in this embodiment described above. This should not constitute any limitation to this application. The heat dissipation apparatus in the embodiments of this application may be applied to various foldable or bendable electronic devices. In addition, the heat dissipation apparatus in the embodiments of this application may also be applied to a tablet-type electronic device, for example, a tablet computer.

Figure 19:
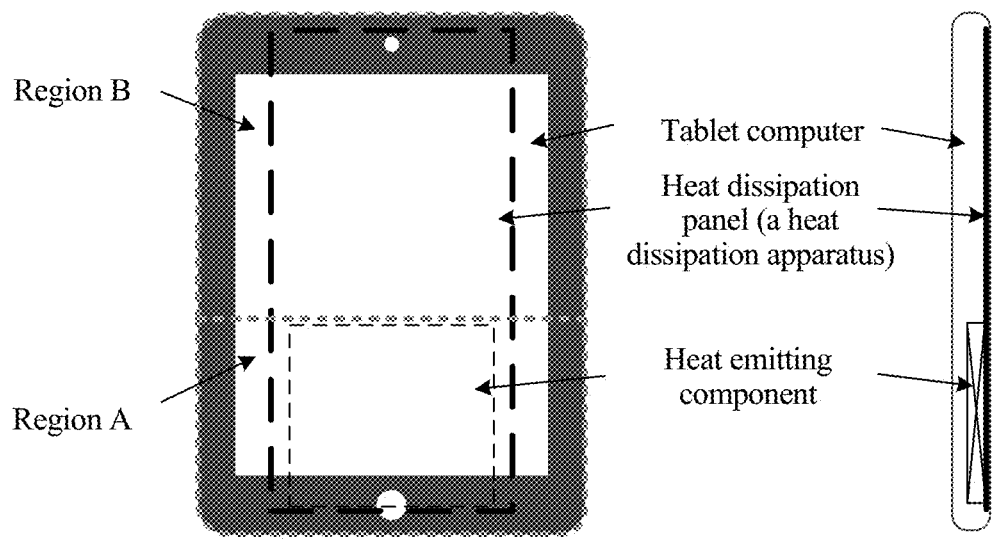
FIG. 19 is a schematic diagram of applying a heat dissipation apparatus to an electronic device according to an embodiment of this application.

FIG. 19 is a schematic diagram of applying a heat dissipation apparatus to an electronic device according to another embodiment of this application. As shown in FIG. 19, the electronic device may be a tablet computer. It is assumed that a heat emitting component in the tablet computer is located at a lower part of the tablet computer (as shown in FIG. 19), and is close to the back of the table computer. FIG. 19 schematically shows structures of the front and a cross section of the tablet computer. The heat dissipation apparatus may be disposed in the electronic device in a form of a tablet. Specifically, the heat dissipation apparatus may include a heat dissipation panel obtained by combining one or more layers of heat conducting materials. Alternatively, the heat dissipation apparatus may include a heat dissipation panel obtained by combining one or more layers of flexible heat conducting materials. The heat conducting material may be any one or more of the foregoing listed heat conducting materials, or the heat conducting material may be another material having relatively high heat conductivity. The flexible heat conducting material may be the flexible heat conducting material provided in this application, or may be another material having both relatively high flexibility and relatively high heat conductivity.

FIG. 19 is a schematic diagram of disposing the heat dissipation panel (marked by using a black heavy solid line and a black thick dashed line in FIG. 19) in the tablet computer. It can be learned that the heat dissipation panel may be divided into two consecutive regions, namely, a first region (a region A marked by using a gray dashed line in FIG. 19) and a second region (a region B marked by a gray dashed line in FIG. 19). The first region is a region close to the heat emitting component, and the second region is a region that extends from the first region to a low-temperature region of the electronic device, namely, a region away from the heat emitting component. An area of the second region is extended to the low-temperature region. To be specific, heat conducted from the first region can be effectively dissipated to the low-temperature region by using the second region, thereby facilitating rapid heat dissipation. Therefore, compared with an air-cooled heat dissipation manner in the prior art, space occupied by the heat dissipation apparatus can be reduced, and a problem of noise and dust generated in an operation process of the heat dissipation apparatus can be alleviated.

Optionally, an area of the first region is less than or equal to the area of the second region.

Specifically, the area of the second region may be increased to be the same as or greater than the area of the first region. To be specific, a heat dissipation area is enlarged, to achieve better temperature equalization and heat dissipation effects and improve heat dissipation efficiency.

In this embodiment of this application, if the heat dissipation panel is disposed in parallel to the back of the tablet computer and is not folded or bent, the heat dissipation panel may include only a heat conducting material or may be a flexible heat dissipation panel. If the heat dissipation panel is bent or folded when being used to dissipate heat for the tablet computer, the heat dissipation panel may be a flexible heat dissipation panel.

Figure 20:
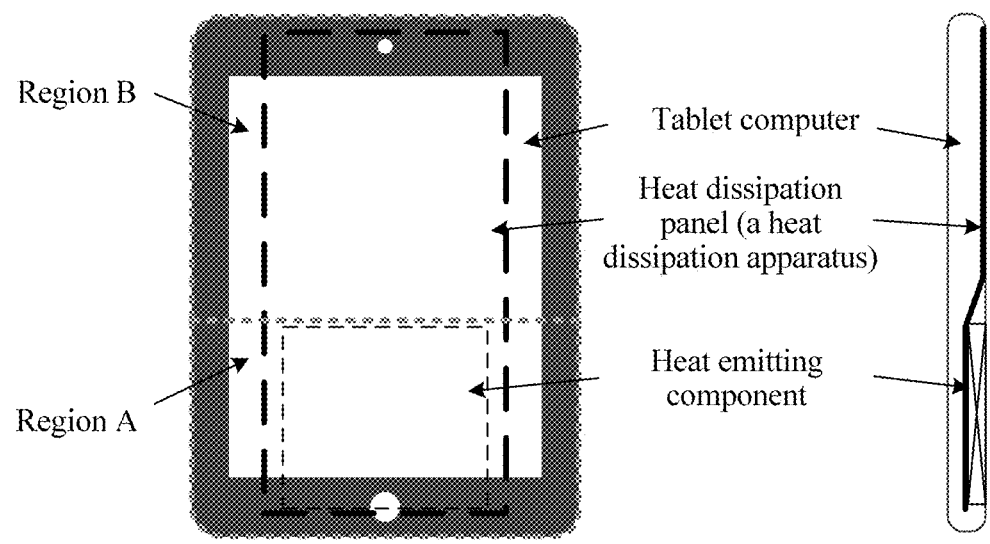
FIG. 20 and FIG. 21 are schematic diagrams of applying a heat dissipation apparatus to an electronic device according to another embodiment of this application.
Figure 21:

FIG. 20 and FIG. 21 are schematic diagrams of applying a heat dissipation apparatus to an electronic device according to another embodiment of this application. As shown in FIG. 20, the electronic device may still be the tablet computer described above. A specific position of a heat emitting element in the table computer may be similar to that shown in FIG. 19. Different from the heat dissipation panel shown in FIG. 19, a heat dissipation panel shown in FIG. 20 is bent. Therefore, the heat dissipation panel may use a flexible heat conducting material having both relatively high flexibility and relatively high heat conductivity. For example, the heat dissipation panel may use the flexible heat conducting material provided in this application, namely, the heat dissipation panel described with reference to FIG. 1 to FIG. 4. However, this should not constitute any limitation to this application. This application does not exclude a material having both high flexibility and high heat conductivity in the prior art or a future technology. For example, the material may be flexible graphite or a flexible vapor chamber (Vapor Chamber, VC).

FIG. 20 is a schematic diagram of disposing the heat dissipation panel (marked by using a black heavy solid line and a black thick dashed line in FIG. 20) in the tablet computer. It can be learned that the heat dissipation panel may be divided into two consecutive parts, namely, a first region and a second region. It can be learned from a cross section that because a heat emitting component in the tablet computer may have particular thickness, a first surface of the first region faces an outer surface of the heat emitting component. Because the heat emitting component is located at a lower part of the tablet computer (a region A marked by using a gray dashed line in FIG. 20), the second region is extended to an upper region (a region B marked by using a gray dashed line in FIG. 20) that is close to the back in the tablet computer, to better dissipate heat. Therefore, an intermediate region between the first region and the second region may be bent.

Therefore, in this embodiment of this application, an area of the second region is extended to a low-temperature region. To be specific, heat conducted from the first region can be effectively dissipated to the low-temperature region by using the second region, thereby facilitating rapid heat dissipation. Compared with an air-cooled heat dissipation manner in the prior art, space occupied by the heat dissipation apparatus can be reduced, and a problem of noise and dust generated in an operation process of the heat dissipation apparatus can be alleviated.

Optionally, an area of the first region is less than or equal to the area of the second region.

Specifically, the area of the second region may be increased to be the same as or greater than the area of the first region. To be specific, a heat dissipation area is enlarged, to achieve better temperature equalization and heat dissipation effects and improve heat dissipation efficiency.

FIG. 21 is a schematic diagram of a cross section of the heat dissipation panel. The heat dissipation panel may be made of the flexible heat conducting material provided in this application. To be specific, the heat dissipation panel may include at least one flexible layer and at least one heat conducting layer. It can be learned from the cross section that the flexible layer is located at an outer part of the heat dissipation panel and the heat conducting layer is located at an inner part of the heat dissipation panel. According to the heat dissipation panel shown in FIG. 21, when the heat dissipation panel needs to be bent or folded, because flexible materials are stuck to two surfaces (namely, a first surface and a second surface) of a heat conducting material, a fillet is formed at a bent or folded position. The fillet is used to protect the heat conducting material from being damaged when the heat conducting material is folded, and avoid breakage or fracture. Due to high flexibility of the flexible material, the heat dissipation panel is less prone to breakage or fracture when being bent or folded. Therefore, reliability of the heat dissipation panel is improved as a whole.

It should be understood that a case of bending the intermediate region on the heat dissipation panel in FIG. 20 is merely example description, and should not constitute any limitation to this application. In some possible scenarios, a surface of the heat emitting component may be uneven. When the heat dissipation panel provided in this application is used, the first region may be bent. According to the heat dissipation panel provided in this application, due to high flexibility of the flexible material, reliability of the heat dissipation panel can be ensured.

Figure 22:
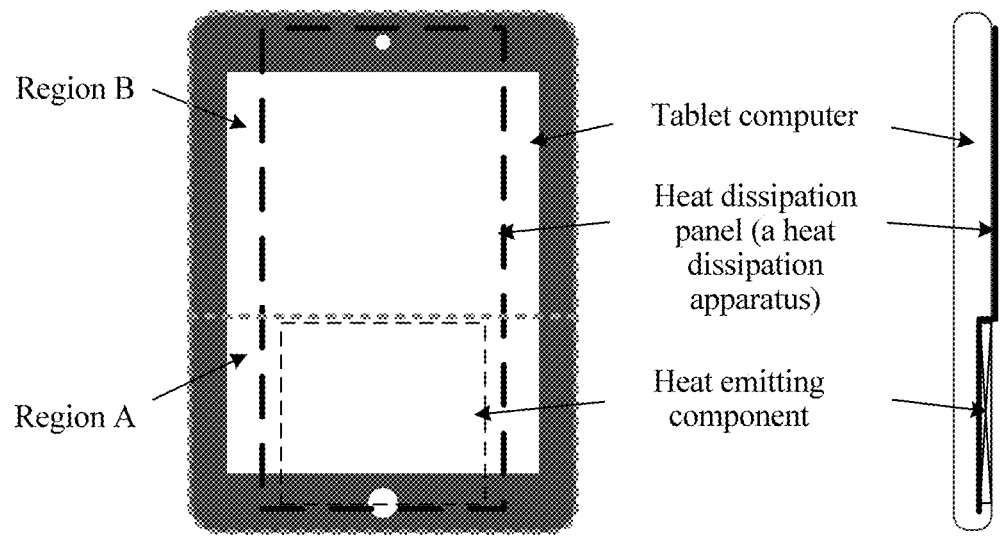
FIG. 22 is a schematic diagram of applying a heat dissipation apparatus to an electronic device according to still another embodiment of this application.

FIG. 22 is a schematic diagram of applying a heat dissipation apparatus to an electronic device according to still another embodiment of this application. As shown in FIG. 22, the electronic device may still be the tablet computer described above. A specific position of a heat emitting element in the table computer may be similar to that shown in FIG. 19 and FIG. 20. Different from the heat dissipation panels shown in FIG. 19 and FIG. 20, a heat dissipation panel shown in FIG. 22 is folded. Therefore, the heat dissipation panel may use a heat dissipation panel having both relatively high flexibility and relatively high heat conductivity. For example, the heat dissipation panel may be made of the flexible heat conducting material provided in this application. However, this should not constitute any limitation to this application. This application does not exclude a material having both high flexibility and high heat conductivity in the prior art or in a future technology. For example, the material may be flexible graphite or a flexible VC.

FIG. 22 is a schematic diagram of disposing the heat dissipation panel (marked by using a black heavy solid line and a black thick dashed line in FIG. 22) in the tablet computer. It can be learned that the heat dissipation panel may still be divided into two consecutive parts, namely, a first region and a second region. It can be learned from a cross section that because a heat emitting component in the tablet computer may have particular thickness, a first surface of the first region faces an outer surface of the heat emitting component. Because the heat emitting component is located at a lower part of the tablet computer (a region A marked by using a gray dashed line in FIG. 22), the second region may be extended to an outer region of the table computer and is specifically located at an upper region on the back of the tablet computer (a region B marked by a gray dashed line in FIG. 22), to better dissipate heat.

Therefore, in this embodiment of this application, an area of the second region is extended to a low-temperature region. To be specific, heat conducted from the first region can be effectively dissipated to the low-temperature region by using the second region, thereby facilitating rapid heat dissipation. Compared with an air-cooled heat dissipation manner in the prior art, space occupied by the heat dissipation apparatus can be reduced, and a problem of noise and dust generated in an operation process of the heat dissipation apparatus can be alleviated.

Optionally, an area of the first region is less than or equal to the area of the second region.

Specifically, the area of the second region is the same as or greater than the area of the first region. To be specific, a heat dissipation area is enlarged, to achieve better temperature equalization and heat dissipation effects and improve heat dissipation efficiency.

Optionally, the second region located at an outer part of the tablet computer may further accelerate heat dissipation in another manner, for example, in an air cooling manner or a water cooling manner. This is not specially limited in this application.

FIG. 22 further shows a schematic diagram of a cross section of the heat dissipation panel. Because the second region is extended to the outer region of the tablet computer, a region between the first region and the second region may be folded. Therefore, the heat dissipation panel may be made of the flexible heat conducting material provided in this application. To be specific, the heat dissipation panel may include at least one flexible layer and at least one heat conducting layer. It can be learned from the cross section that the flexible material is located at an outer part of the heat dissipation panel, and the heat conducting material is located at an inner part of the heat dissipation panel. Due to high flexibility of the flexible material, the heat dissipation panel is less prone to breakage when being folded on a folded position on an intermediate region, thereby improving reliability of the heat dissipation panel.

It should be understood that a case of folding the intermediate region on the heat dissipation panel in FIG. 22 is merely example description, and should not constitute any limitation to this application. In some possible scenarios, surfaces of heat emitting components may not be located on a same plane. When the heat dissipation panel provided in this application is used, the first region may need to be folded to better absorb heat released by a heat emitting part. According to the heat dissipation panel provided in this application, due to high flexibility of a flexible material, reliability of the heat dissipation panel is ensured.

It should be further understood that the foregoing shows a plurality of possible schematic diagrams of the heat dissipation panel and the heat dissipation apparatus with reference to the accompanying drawings. However, this should not constitute any limitation to this application. The heat dissipation panel may be any one shown in FIG. 1 to FIG. 4. In addition to any heat dissipation panel shown in FIG. 1 to FIG. 4, the heat dissipation apparatus may further include one or more of the reinforced plate (as shown in FIG. 11), the shielding cover (as shown in FIG. 12 to FIG. 14), the fan (as shown in FIG. 15 and FIG. 16), and the strip-shaped thermal pads (as shown in FIG. 17 and FIG. 18). This is not specially limited in this application.

According to the foregoing embodiments, the heat dissipation panel and the heat dissipation apparatus that are provided in this application can be applied to various non-folded, foldable, or bendable electronic devices. Flexibility of the heat dissipation panel is improved by using the flexible material, and heat dissipation efficiency of the heat dissipation panel is improved by using the heat conducting material. Compared with an air-cooled heat dissipation manner in the prior art, space occupied by the heat dissipation apparatus can be reduced, and a problem of noise and dust generated in an operation process of the heat dissipation apparatus can be alleviated.

This application further provides an electronic device. The electronic device includes a heat emitting component and a heat dissipation apparatus in the electronic device. Specifically, the heat dissipation apparatus may be any one of the heat dissipation apparatuses described in the foregoing embodiments.

It should be understood that the heat dissipation panel and the specific method for applying a heat dissipation apparatus to an electronic device to dissipate heat in the embodiments of this application are described above in detail with reference to FIG. 5 to FIG. 10, FIG. 12, FIG. 15 to FIG. 17, FIG. 19, FIG. 20, and FIG. 22. For brevity, details are not described herein again.

A person of ordinary skill in the art may be aware that the units and algorithm steps in the examples described with reference to the embodiments disclosed in this specification may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for convenient and brief description, reference may be made to a corresponding process in the method embodiments for a detailed working process of the system, apparatus, and unit. Details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electrical, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of this application may be integrated into one processing unit, or each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The foregoing storage medium includes: any medium that can store program code such as a USB flash drive, a removable hard disk, a read-only memory (Read-Only Memory, ROM), a random access memory (Random Access Memory, RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A heat dissipation apparatus that comprises a heat dissipation panel built in an electronic device, wherein the heat dissipation panel comprises:
 a first heat conducting layer comprising a first surface and a second surface, wherein the first surface is exposed to the outside when the first heat conducting layer is bent, the second surface is opposite to the first surface, the first heat conducting layer including a first region configured to absorb heat released by a heat emitting component and to conduct the heat to a second region on the first heat conducting layer to dissipate the heat, an area of the first region being less than an area of the second region;
 a first flexible layer comprising a third region, wherein the third region adheres to a bending region on the second surface of the first heat conducting layer; and
 wherein the heat dissipation apparatus further comprises a reinforced plate adhered to a position on an upper surface of the heat dissipation panel or a lower surface of the heat dissipation panel and that corresponds to the bending region, the lower surface of the heat dissipation panel facing the heat emitting component and the upper surface of the heat dissipation panel opposite the lower surface.

2. The heat dissipation apparatus according to claim 1, wherein the first flexible layer further comprises a fourth region adhering to the second surface of the first heat conducting layer outside the bending region, the third region and the fourth region completely covering the second surface of the first heat conducting layer.

3. The heat dissipation apparatus according to claim 1, wherein the heat dissipation panel further comprises a second flexible layer that adheres to the first surface of the first heat conducting layer, the second flexible layer partially or completely covering the first surface of the first heat conducting layer when the first heat conducting layer is not bent.

4. The heat dissipation apparatus according to claim 1, wherein the heat dissipation apparatus further comprises a fan located in a high-temperature region of the electronic device to enable air to flow between the high-temperature region and a low-temperature region so that the heat is to be conducted from the first region on the first heat conducting layer to the second region, wherein the high-temperature region is a region closer to the heat emitting component in the electronic device than the low-temperature region.

5. The heat dissipation apparatus according to claim 1, wherein the heat dissipation apparatus further comprises a shielding cover disposed on the lower surface of the heat dissipation panel and a shielding base disposed in the electronic device, the shielding cover and the shielding base forming a shielding case that is configured to shield a chip, wherein the lower surface of the heat dissipation panel faces the heat emitting component.

6. The heat dissipation apparatus according to claim 5, wherein the shielding cover is built in a lower layer of material of the heat dissipation panel, the lower layer of material being a material layer of the heat dissipation panel that is closest to the heat emitting component.

7. The heat dissipation apparatus according to claim 5, wherein the shielding cover is adhered to the lower surface of the heat dissipation panel.

8. The heat dissipation apparatus according to claim 1, wherein the reinforced plate comprises an attached stainless steel sheet or copper alloy sheet.

9. The heat dissipation apparatus according to claim 1, wherein the first heat conducting layer comprises a plurality of separated strip-shaped thermal pads arranged in parallel on the bending region, each strip-shaped thermal pad being parallel to or approximately parallel to a heat conducting direction.

10. The heat dissipation apparatus according to claim 1, wherein the first heat conducting layer is made of a heat conducting material with a coefficient of heat conductivity that is greater than or equal to 50 watt/(meter-kelvin).

11. The heat dissipation apparatus according to claim 10, wherein the heat conducting material comprises graphite, copper foil, or aluminum foil.

12. The heat dissipation apparatus according to claim 1, wherein the first flexible layer is made a flexible material that comprises polyimide or polyamide.

13. The heat dissipation apparatus according to claim 1, wherein the bending region having a width that is less than a width of the second region.

* * * * *